(12) United States Patent
Chang

(10) Patent No.: US 6,528,872 B2
(45) Date of Patent: Mar. 4, 2003

(54) PACKAGING STRUCTURE FOR BALL GRID ARRAY

(75) Inventor: Nai-Shung Chang, Taipei Hsien (TW)

(73) Assignee: Via Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/127,082

(22) Filed: Apr. 19, 2002

(65) Prior Publication Data

US 2002/0153605 A1 Oct. 24, 2002

Related U.S. Application Data

(60) Provisional application No. 60/285,028, filed on Apr. 19, 2001.

(30) Foreign Application Priority Data

Nov. 2, 2001 (TW) ...................................... 090127244 A

(51) Int. Cl.[7] .............................................. H01L 23/52
(52) U.S. Cl. ........................ 257/691; 257/780; 257/786
(58) Field of Search ................................. 257/691, 780, 257/781, 664, 786

(56) References Cited

U.S. PATENT DOCUMENTS 5,483,099 A * 1/1996 Natarajan et al.
5,977,626 A * 11/1999 Wang et al.
6,057,596 A * 5/2000 Lin et al.
6,064,113 A * 5/2000 Kirkman
6,160,705 A * 12/2000 Stearns et al.
6,320,757 B1 * 11/2001 Liu
6,380,048 B1 * 4/2002 Boon et al.
6,420,253 B2 * 7/2002 Applelt et al.
6,424,032 B1 * 7/2002 Ikemoto et al.

* cited by examiner

Primary Examiner—Sheila V. Clark
(74) Attorney, Agent, or Firm—J.C. Patents

(57) ABSTRACT

A ball grid array packaging structure for sealing a silicon chip on a substrate is disclosed. The substrate includes a front wiring layer and a back wiring layer. The front wiring layer includes a plurality of inner power rings and an outer power ring. The inner power rings are attached and together they surround a central region where the silicon chip is attached. The inner power rings and the outer power ring have a substantially identical width and the outer power ring surrounds all the inner power rings. The back wiring layer has a large number of interface power balls and core power balls. The interface power balls may be further subdivided into groups of inner power balls, while each group of inner power balls corresponds and couples with one of the inner power rings of the front wiring layer. The core power balls connect with the outer power ring and surround the interface power balls.

15 Claims, 3 Drawing Sheets

PACKAGING STRUCTURE FOR BALL GRID ARRAY

CROSS-REFERENCE TO RELATED APPLICATION

This application claims the priority benefits of U.S. provisional application titled" "SUBSTRATE LAYOUT METHOD" filed on Apr. 19, 2001, Ser. No. 60/285,028. All disclosure of this application is incorporated herein by reference. This application also claims the priority benefit of Taiwan application Ser. No. 90127244, filed Nov. 2, 2001.

BACKGROUND OF THE INVENTION

1. Field of Invention

The present invention relates to an integrated circuit packaging structure. More particularly, the present invention relates to a packaging structure for a ball grid array that has a small and stable electrical inductance, a small power swing range and ground bouncing, and a capacity to accommodate more power vias.

2. Description of Related Art

Ball grid array (BGA) is a new type of high-pin-count integrated circuit (IC) package, which is an ideal packaging approach for housing ultra-large scale integration (ULSI) chip fabricated using deep sub-micron technology. Due to increasing functional complexity of integrated circuits, the number of transistor units in any single chip increases rapidly. Hence, conventional quad flat pack (QFP) or pin-grid array (PGA) is no longer able to meet the demands for connectivity. For example, QFP or PGA provides at most a hundred to two hundred IC pins, which is barely enough for connecting any slightly complicated digital logic electronic circuits with external devices.

In general, for a personal computer having a conventional 64-bit microprocessor, the core logic circuit must connect with the microprocessor, system main memories such as dynamic random access memory (DRAM) and cache memory such as static random access memory (SRAM) using a full 64-bit wide bus. Consequently, if the core logic is fabricated on a single IC chip, various data buses and corresponding address buses together already demands close to two hundred pins. Since additional control signal lines must also be provided, more than three hundred pins are often required. Currently, BGA is one of the major types of IC packaging that is able to provide for such a high pin count.

A ball grid array package is based on a substrate made from a small printed circuit board (PCB). Any ordinary person familiar with the fabrication technique may know that the packaging process involves the transference of a die by a pick-and-place machine to the surface of the substrate. Thereafter, a wire-bonding machine electrically connects the bonding pads on the circuit chip with bonding pads on the ball grid array printed circuit board using metallic wires. The entire circuit chip including the bonding wires and bonding pads is sealed by plastic in a mold injection operation. Finally, after the plastic is hardened, hundreds of solder balls are attached to the back of the substrate by conducting a solder reflow operation.

In brief, due to the complicated logic functions provided by most ICs and the high operating frequency, IC packages must provide a sufficiently large number of input/output (I/O) pads and overall length of die-to-lead wiring connections must be the smallest possible. In recent years, BGA has become one of the mainstream techniques for packaging highly integrated ICs. Major advantages of BGA packaging includes:

(1) The package can provide a large number of input/output pads.
(2) The package has relatively small external dimensions and hence is particularly suitable for use inside small portable devices such as a notebook computer.
(3) Lead line induction inside the package is relatively small. Hence, ICs may operate at relatively high frequency. Moreover, ground bounce is greatly reduced.
(4) Reflow between solder balls and the PCB rather than the insertion of lead pins into socket holes prevents bending or offset of lead pins during transportation.

FIG. 1 is a schematic top view showing the structural layout of a conventional ball grid array package. As shown in FIG. 1, the front side of the substrate 170 has a central region 180 for attaching a die. Surrounding the central region 180 are a first inner power ring 110, a second inner power ring 120, a third inner power ring 130, a fourth inner power ring 140, a fifth inner power ring 150 and an outer power ring 160. The various inner power rings (110, 120, 130, 140 and 150) and the outer power ring 160 all have different widths. The narrowest region among the inner power rings has a width of about 279 µm while the narrowest region in the outer power ring has a width of about 206 µm. With such a power ring layout, non-uniform inductive effects may be produced when power is supplied to various power rings. Ultimately, a large power swing range is produced and the number of vias (or, through holes) is reduced leading to unstable power transmission and production of deviant electrical characteristics.

SUMMARY OF THE INVENTION

Accordingly, one object of the present invention is to provide a packaging structure for a ball grid array that has a small and stable electrical inductance, a small power swing range and ground bouncing and a capacity to accommodate more power vias. Hence, the stability of the power ring transmission source is increased and basic electrical properties of the packages are improved.

To achieve these and other advantages and in accordance with the purpose of the invention, as embodied and broadly described herein, the invention provides a packaging structure for sealing up a silicon chip inside a ball grid array package. The packaging structure comprises of a substrate, a plurality of interface power balls and a plurality of core power balls.

The substrate at least includes a back wiring layer and a front wiring layer. The front wiring layer has a central region, a plurality of inner power rings and an outer power ring while the silicon chip is attached to the central region. Various inner power rings are connected to the silicon chip electrically and the inner power rings are formed next to each other surrounding the central region. Each inner power ring has a substantially identical width and a plurality of vias within the inner power ring and each inner power ring has a different interface voltage. Similarly, the outer power ring connects electrically with the silicon chip and has a substantially uniform width. The outer power ring is close to the inner power rings and encloses all the inner power rings. In addition, the outer power ring has a plurality of vias within the outer power ring and a core voltage Vcore is applied to the outer power ring.

The interface power balls are attached to the back wiring layer and subdivided into a plurality of groups associated with inner power balls, while each group of inner power balls corresponds to one of the inner power rings. Each inner power ball is connected to the corresponding inner power ring through a via so that a proper interface voltage may apply to each inner power ring through the inner power ball. Similarly, the core power balls are attached to the back wiring layer. The core power balls surround the interface power balls and connect with the outer power ring through vias so that a proper core voltage may be applied to the outer power ring.

In one embodiment of this invention, the outer power ring vias are located on one side of the outer power ring further away from the central region. Similarly, the inner power ring vias of each inner power ring are located on one side of the inner power ring further away from the central region. The package structure of this invention further includes a number of metallic wires for connecting the inner power ring with the silicon chip. Pads for bonding metallic wires to the silicon chip are located on the side of the inner power ring closer to the central region. Metallic wires are also used for connecting the outer power ring with the silicon chip. Similarly, pads for bonding metallic wires to the silicon chip are located on the side of the outer power ring closer to the central region.

Since the widths of various inner power rings and that of the outer power ring on the substrate are widened in addition to having an identical dimension, electrical inductance is lowered at the same time. The lowering of electrical inductance leads to a reduction in power swing range and ground bouncing, and an increase in the number of vias can be accommodated by the substrate. Consequently, power transmission quality and stability of the ball grid array package all improve.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
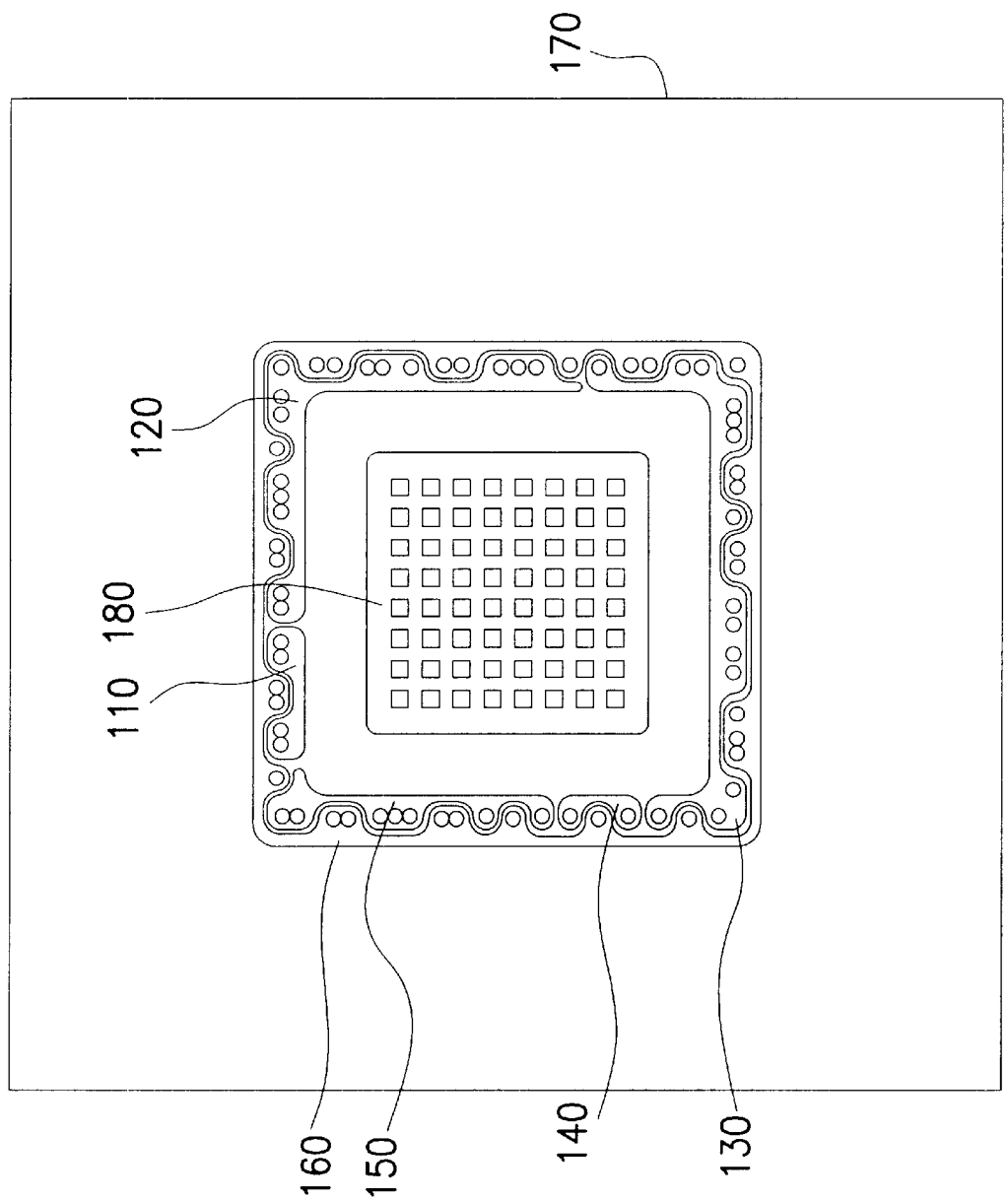
FIG. 1 is a schematic top view showing the structural layout of a conventional ball grid array package.

The power vias are constrained by pre-defined specifications to enclose the central region 180 with a single ring, and drawbacks as described in background will be arisen under the layout structure shown in FIG. 1. The disclosed method breaks down the rules of the conventional specifications and obtains more spaces and resources for layout and design. Reference will now be made in detail to the present preferred embodiments of the invention, examples of which are illustrated in the accompanying drawings. Wherever possible, the same reference numbers are used in the drawings and the description to refer to the same or like parts.

Figure 2:
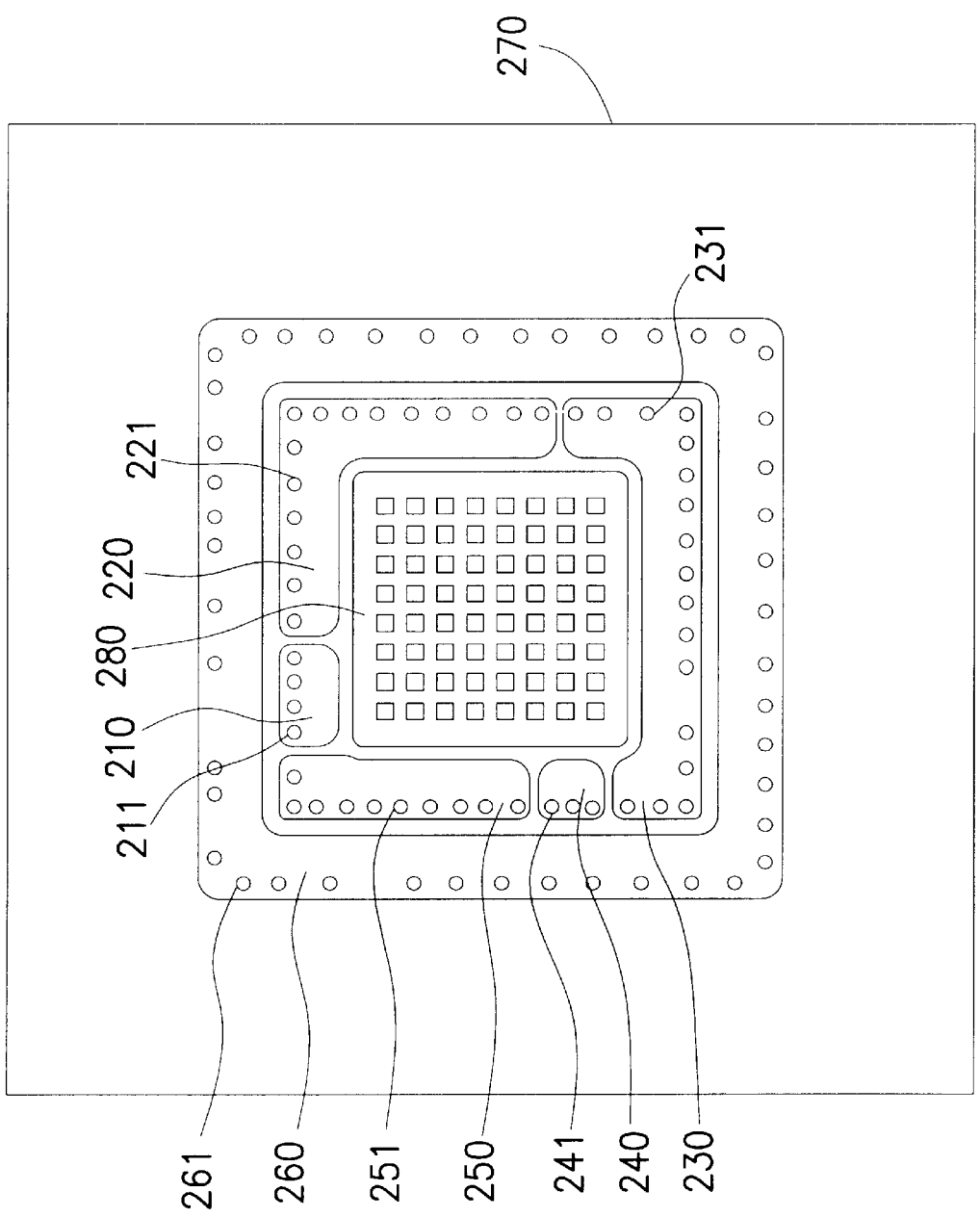
FIG. 2 is a schematic top view showing the structural layout of a ball grid array package according to one preferred embodiment of this invention.
Figure 3:
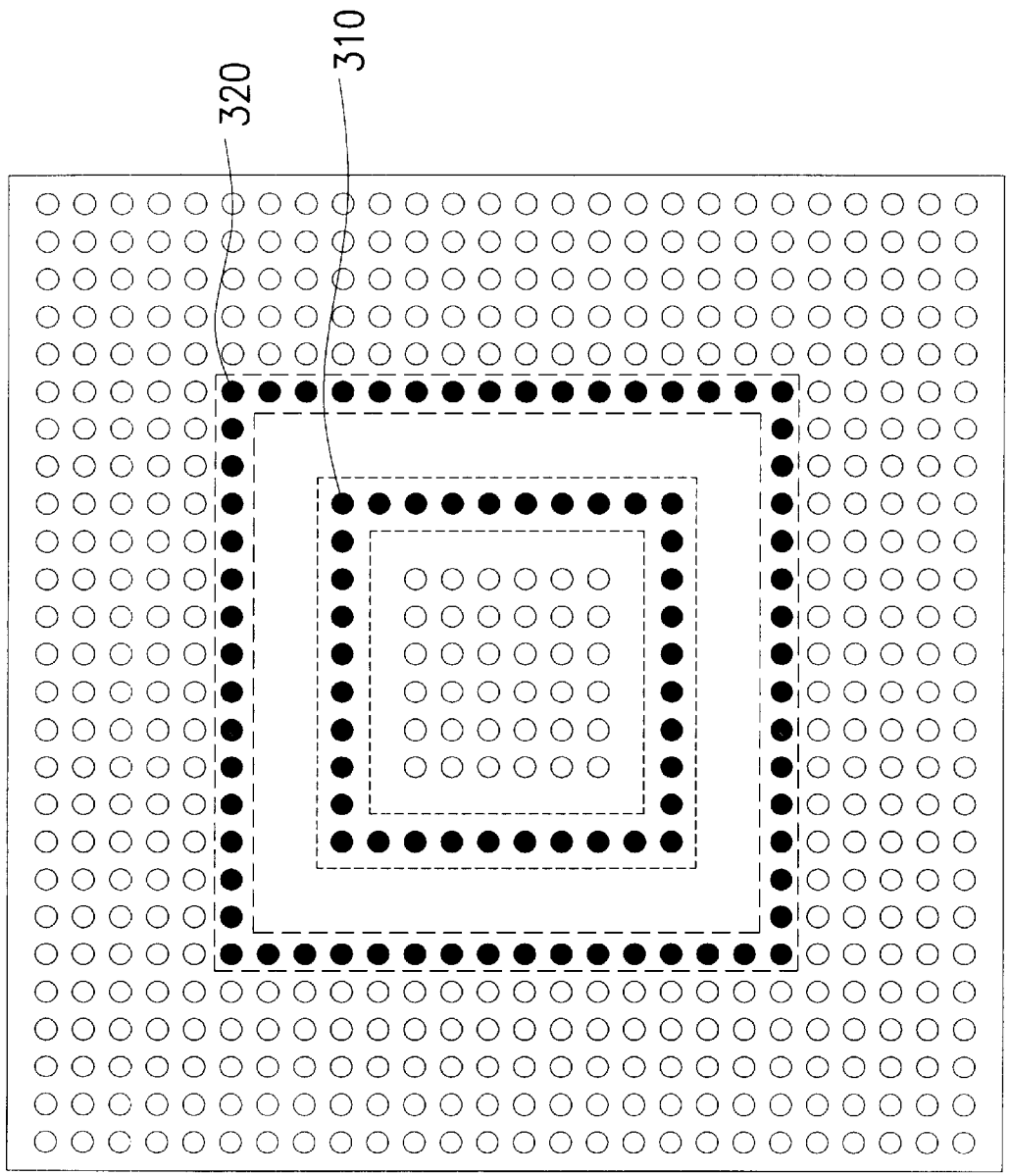
FIG. 3 is a schematic view showing the back of a ball grid array package fabricated according to one preferred embodiment of this invention.

FIG. 2 is a schematic top view showing the structural layout of a ball grid array package according to one preferred embodiment of this invention. FIG. 3 is a schematic view showing the back of a ball grid array package fabricated according to one preferred embodiment of this invention. As shown in FIGS. 2 and 3, the packaging structure is suitable for sealing a silicon chip within a ball grid array package. The packaging structure at least includes a substrate 270, a plurality of interface power balls 310, a plurality of core power balls 320 and a number of other solder balls for the application of signals.

The substrate 270 at least includes a back wiring layer and a front wiring layer. For example, a substrate may have altogether four layers arranged from top to bottom that include a front wiring layer, a grounding layer, a power layer and a back wiring layer. As shown in FIG. 2, the front wiring layer at least includes a central region 280, a plurality of inner power rings (a first inner power ring 210, a second inner power ring 220, a third inner power ring 230, a fourth inner power ring 240 and a fifth inner power ring 250) and an outer power ring 260. A silicon chip (not shown) is attached to the central region 280.

All the inner power rings 210, 220, 230, 240 and 250 have a plurality of arcing metallic wires (not shown) bonded from the rings to the output pads on the silicon chip. The inner power rings 210, 220, 230, 240 and 250 circle around the central region 280 adjacently, while each inner power ring has a substantially identical width. Furthermore, each inner power ring has a plurality of vias (a plurality of first power vias 211, a plurality of second power vias 221, a plurality of third power vias 231, a plurality of fourth power vias 241 and a plurality of fifth power vias 251) for electrical connectivity. In other words, all the first power vias 211 are connected to the first inner power ring 210, all the second power vias 221 are connected to the second inner power ring 220, all the third power vias 231 are connected to the third inner power ring 230, all the fourth power vias 241 are connected to the fourth inner power ring 240 and all the fifth power vias 251 are connected to the fifth inner power ring 250. In addition, a different interface voltage is applied to each inner power ring. For example, the interface voltage applied to a DRAM is different from the interface voltage applied to an AGP.

Similarly, the outer power ring 260 has a plurality of arcing metallic wires (not shown) bonded from the ring to the output pads of the silicon chip. Here, length of the arcing metallic wires used for coupling with the silicon chip is longer than that for coupling the inner power rings 210, 220, 230, 240 and 250 with the silicon chip. The outer power ring 260 also has a substantially identical ring width and encloses all the adjacent inner power rings 210, 220, 230, 240 and 250. In addition, the outer power ring 260 has a plurality of vias 261 for the application of a core voltage.

All the solder balls (including the interface power balls 310 and the core power balls 320) are attached to the back wiring layer. Because each inner power ring has a different interface voltage, the interface power balls 310 may be further subdivided into rings of inner power balls. Each ring of inner power balls corresponds to one of the inner power rings 210, 220, 230, 240 and 250. Connections between various balls and corresponding inner power rings are achieved through respective inner power vias so that suitable external interface voltages can be applied to the respective inner power rings. Similarly, the core power balls 320 center upon the central silicon chip while enclosing the interface power balls 310. The core power balls 320 are electrically connected to the outer power ring 260 through vias 261 so that a suitable core voltage is applied to the outer power ring.

The packaging structure of this invention includes a large number of other arcing metallic wires for connection between the inner power rings 210, 220, 230, 240, 250 and the silicon chip or for connection between the outer power ring 260 and the silicon chip. Hence, as shown in FIG. 2, the outer power vias 261 are formed on one side of the outer power ring 260 further away from the central region 280. Similarly, the inner power vias 211, 221, 231, 241, 251 are formed on one side of the respective inner power rings 210, 220, 230, 240, 250 further away from the central the central region 280. With this arrangement, the free-up area on the inner power regions 210, 220, 230, 240, 250 closer to the central region 280 may serve as pads for bonding one end of the arcing metallic wires. Likewise, the free-up area on the outer power ring 260 closer to the central region may serve as pads for bonding one end of the arcing metallic wires.

In summary, one major aspect of the ball grid array structure of this invention is to identically widen the widths of the inner and outer power rings in the substrate. In this embodiment, the narrowest area in the power rings is increased to about 800 $\mu$m. Hence, electrical inductance of internal circuit inside the package is reduced leading to a reduction in power swing range and ground bouncing and an increase in the number of vias that can be accommodated by the substrate. Ultimately, both power transmission quality and stability of the ball grid array package are improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A ball grid array packaging structure for sealing a silicon chip on a substrate having a front wiring layer, the front wiring layer comprising:
   a central region for attaching the silicon chip;
   a plurality of inner power rings each coupled to the silicon chip, wherein the inner power rings surround the central region, each one of the inner power rings has a substantially identical width and each one of said inner power rings has a plurality of vias electrically connected to said associated inner power ring, and each one of the inner power ring receives a different interface voltage; and
   an outer power ring coupled to the silicon chip, wherein the outer power ring surrounds the inner power rings, the outer power ring has a plurality of vias electrically connected to the outer power ring, and the outer power ring receives a core voltage.

2. The packaging structure of claim 1, wherein the outer power vias are in the outer power ring further away from the central region, and the packaging structure further includes a metallic wire for connecting the outer power ring and the silicon chip such that a bonding pad of the metallic wire is in an area of the outer power ring closer to the central region.

3. The packaging structure of claim 1, wherein the vias of each one of the inner power ring are in an area of the associated inner power ring further away from the central region, and the packaging structure further includes a plurality of metallic wires for connecting the inner power rings and the silicon chip such that bonding pads of the metallic wires are in an area of the associated inner power ring closer to the central region.

4. The packaging structure of claim 1, wherein the number of the inner power rings on the substrate is five.

5. A ball grid array packaging structure for sealing a silicon chip, comprising:
   a substrate having a back wiring layer and a front wiring layer, wherein the silicon chip is positioned over a front wiring layer;
   a plurality of grounding balls attached to a back wiring layer in positions corresponding to the silicon chip on the front wiring layer;
   a plurality of interface power balls attached to the back wiring layer symmetrically surrounding the grounding balls, wherein the interface power balls are subdivided into groups of inner power balls with each group of the inner power balls coupled to the silicon chip so that each one of the inner power ball may receive a different interface voltage; and
   a plurality of core power balls attached to the back wiring layer symmetrically surrounding the interface power balls, wherein the core power balls all connect to the silicon chip so that the core power balls may receive a core voltage.

6. The packaging structure of claim 5, wherein said front layer comprises five rings.

7. The packaging structure of claim 5, wherein the front wiring layer further includes:
   a central region for attaching the silicon chip;
   a plurality of inner power rings each coupled to the silicon chip, wherein the inner power rings surround the central region, each one of the inner power rings has a substantially identical width and each one of the inner power rings has a plurality of vias electrically connected to the inner power ring, and each one of the inner power rings receives a different interface voltage; and
   an outer power ring coupled to the silicon chip, wherein the outer power ring surrounds the inner power rings, the outer power ring has a plurality of vias electrically connected to the outer power ring, and the outer power ring receives a core voltage.

8. The packaging structure of claim 7, wherein the outer power vias are in the outer power ring further away from the central region, and the packaging structure further includes a metallic wire for connecting the outer power ring and the silicon chip such that a bonding pad of the metallic wire is in an area of the outer power ring closer to the central region.

9. The packaging structure of claim 7, wherein the vias of each inner power ring are in an area of the inner power ring further away from the central region, and the packaging structure further includes a plurality of metallic wires for connecting the inner power rings and the silicon chip such that bonding pads of the metallic wires are in an area of the inner power rings closer to the central region.

10. A ball grid array packaging structure for sealing a silicon chip, comprising:
    a substrate, having:
       a front wiring layer, having:
          a central region for attaching the silicon chip;
          a plurality of inner power rings each coupled to the silicon chip, wherein the inner power rings are adjacent and surround the central region, each one of the inner power rings has a substantially identical width and each one of the inner power rings has a plurality of vias electrically connected to the associated inner power ring, and each one of the inner power rings receives a different interface voltage; and
          an outer power ring coupled to the silicon chip, wherein the outer power ring surrounds the inner power rings, the outer power ring has a plurality of vias electrically connected to the outer power ring, and the outer power ring receives a core voltage; and a back wiring layer, having:

a plurality of interface power balls attached to the back wiring layer, wherein the interface power balls may be further subdivided into groups of inner power balls, each group of the inner power balls corresponds electrically with one of the inner power rings, the inner power balls and corresponding power rings are electrically connected through vias so that each one of the inner power rings may receive an interface voltage; and a plurality of core power balls attached to the back wiring layer, wherein the core power balls center upon and surround the interface power balls, and the core power balls and the outer power ring are electrically connected through vias so that the outer power ring may receive a core voltage.

11. The packaging structure of claim 10, wherein the outer power vias are formed on one side of the outer power ring further away from the central region.

12. The packaging structure of claim 11, wherein the packaging structure further includes a metallic wire electrically connecting the outer power ring and the silicon chip, and a pad for bonding one end of the metallic wire is located on one side of the outer power ring closer to the central region.

13. The packaging structure of claim 11, wherein the inner power vias of each one of the inner power rings are formed on one side of the inner power ring further away from the central region.

14. The packaging structure of claim 13, wherein the packaging structure further includes a plurality of metallic wires electrically connecting the outer power ring and the silicon chip, and pads for bonding one end of the metallic wires are located on one side of the outer power ring closer to the central region.

15. The packaging structure of claim 1, wherein the number of inner power rings is five.

* * * * *